United States Patent
Huh et al.

(10) Patent No.: US 7,646,044 B2
(45) Date of Patent: Jan. 12, 2010

(54) THIN FILM TRANSISTOR AND THIN FILM TRANSISTOR ARRAY PANEL

(75) Inventors: Jong-Moo Huh, Hwaseong-si (KR); Joon-Hak Oh, Seoul (KR); Joon-Hoo Choi, Seoul (KR); In-Su Joo, Seongnam-si (KR); Beohm-Rock Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/996,303

(22) Filed: Nov. 22, 2004

(65) Prior Publication Data

US 2005/0127367 A1   Jun. 16, 2005

(30) Foreign Application Priority Data

Nov. 20, 2003   (KR) ...................... 10-2003-0082565

(51) Int. Cl.
    *G02F 1/136* (2006.01)
(52) U.S. Cl. ...................... 257/286; 349/149
(58) Field of Classification Search ................ 257/59, 257/72, 286, 288; 349/149
    See application file for complete search history.

(56) References Cited

U.S. PATENT DOCUMENTS

| | | | | |
|---|---|---|---|---|
| 5,407,846 A | * | 4/1995 | Chan | ........................... 438/156 |
| 5,508,531 A | * | 4/1996 | Ha | .............................. 257/57 |
| 5,554,861 A | * | 9/1996 | Mano et al. | .................... 257/71 |
| 6,066,860 A | * | 5/2000 | Katayama et al. | .............. 257/71 |
| 6,356,029 B1 | * | 3/2002 | Hunter | ..................... 315/169.1 |
| 6,583,830 B2 | * | 6/2003 | Yasukawa et al. | ............. 349/43 |
| 2002/0158277 A1 | * | 10/2002 | Harada et al. | ................ 257/288 |
| 2002/0180671 A1 | * | 12/2002 | Inukai | ......................... 345/76 |
| 2003/0098657 A1 | * | 5/2003 | Suzuki | .................... 315/169.3 |
| 2003/0169381 A1 | * | 9/2003 | Kawachi et al. | ............... 349/43 |
| 2003/0186488 A1 | * | 10/2003 | Wen et al. | .................... 438/149 |
| 2005/0023569 A1 | * | 2/2005 | Yang | ........................... 257/213 |

FOREIGN PATENT DOCUMENTS

| | | | |
|---|---|---|---|
| JP | 09260675 A | * | 10/1997 |
| JP | 2000299473 A | * | 10/2000 |

OTHER PUBLICATIONS

S. Wolf "Silicon Processing for the VLSI Era", vol. 2—Process Intergation, p. 89 (ISBN: 0-961672-4-5), Lattice Press, Sunset Beach, California (1990).*
S. Wolf "Silicon Processing for the VLSI Era", vol. 3—The Submicron MOSFET, pp. 289, 291, 292, 311 and 312; Lattice Press, Sunset Beach, CA (1995).(ISBN: 0-961672-5-3).*

* cited by examiner

*Primary Examiner*—Thomas L Dickey
(74) *Attorney, Agent, or Firm*—Innovation Counsel LLP

(57) ABSTRACT

A thin film transistor is provided, which includes: a semiconductor layer including an intrinsic portion; a gate electrode overlapping the intrinsic portion; a gate insulating layer disposed between the semiconductor layer and the gate electrode; and source and drain electrodes that have edges opposing each other with respect to the intrinsic portion of the semiconductor layer and are connected to the semiconductor layer, wherein the intrinsic portion has a curved surface contacting the gate insulating layer.

16 Claims, 13 Drawing Sheets

THIN FILM TRANSISTOR AND THIN FILM TRANSISTOR ARRAY PANEL

BACKGROUND OF THE INVENTION (a) Field of the Invention

The present invention relates to a thin film transistor and a thin film transistor array panel.

(b) Description of Related Art

A thin film transistor array panel is used for a display device such as a liquid crystal display (LCD) or an organic light emitting display (OLED), which includes a plurality of pixels independently driven by thin film transistors (TFTs).

An LCD generally includes two panels having field generating electrodes and a liquid crystal layer interposed therebetween. This LCD displays desired images by applying electric field using the electrodes to the liquid crystal layer with dielectric anisotropy and adjusting the strength of the electric field to control the amount of light passing through the panels. In this case, TFTs are used for controlling signals transmitted to the electrodes.

An OLED is a self emissive display device, which displays images by exciting an emissive organic material to emit light. The OLED includes an anode (hole injection electrode), a cathode (electron injection electrode), and an organic light emission layer interposed therebetween. When the holes and the electrons are injected into the light emission layer, they are recombined and pair annihilated with emitting light. The light emission layer further includes an electron transport layer (ETL) and a hole transport layer (HTL) as well as an electron injecting layer (EIL) and a hole injecting layer (HIL) for enhancing the light emission. Each pixel of the OLED includes two TFTs, i.e., a switching TFT and a driving TFT. The current for light emission is driven by the driving TFT and the mount of the current driven the driving TFT is controlled by the data signals from the switching TFT.

The most commonly used TFTs for an LCD adapts amorphous silicon as a semiconductor layer.

An amorphous silicon TFT has mobility of about 0.5 to 1 $cm^2/Vsec$, which is suitable for a switching element of an LCD. However, it is not sufficient for a driving circuit of a display device.

In order to overcome such a problem, an OLED or a polysilicon TFT LCD using a polysilicon with electron mobility of 20-150 $cm^2/Vsec$ as a semiconductor layer has been developed. The relatively high electron mobility polysilicon TFT enables to implement a chip in glass technique that a display panel embeds its driving circuits.

In these display devices, the current driving capacity of the TFTs are required to be increased for the display characteristics of the pixels and for increased size and resolution of the display devices. In addition, when a driver for driving the TFTs for the pixels is integrated on the TFT array panel, the driver includes a plurality of TFTs that require higher current driving capacity than the TFTs for the pixels.

The current driving capacity of the TFTs can be increased by enlarging the channel width of the TFTs and the enlargement of the channel width also requires the increase the electrodes of the TFTs to reduce the aperture ratio of the display device since the electrodes of the TFTs are usually made of opaque metal.

SUMMARY OF THE INVENTION

A motivation of the present invention is to solve the problems of conventional techniques.

A thin film transistor is provided, which includes: a semiconductor layer including an intrinsic portion; a gate electrode overlapping the intrinsic portion; a gate insulating layer disposed between the semiconductor layer and the gate electrode; and source and drain electrodes that have edges opposing each other with respect to the intrinsic portion of the semiconductor layer and are connected to the semiconductor layer, wherein the intrinsic portion has a curved surface contacting the gate insulating layer.

The intrinsic portion may have a curved section including the curved surface and the curved surface may have a wavelike shape.

The gate insulating layer may have a curved section and the gate electrode may include a first film disposed and a second film disposed closer to the semiconductor layer than the first film and including a plurality of bars extending between the source electrode and the drain electrode.

The gate electrode may have a curved section.

The semiconductor layer may include amorphous silicon and the thin film transistor may further include ohmic contacts disposed between the semiconductor layer and the source and the drain electrodes.

The semiconductor layer may include polysilicon, and the semiconductor layer may further include extrinsic portions disposed opposite each other with respect to the intrinsic portion and connected to the source and the drain electrodes.

A thin film transistor array panel is provided, which includes: a semiconductor layer including an intrinsic portion; a first signal line including a gate electrode overlapping the intrinsic portion; a gate insulating layer disposed between the semiconductor layer and the gate electrode; a second signal line including a source electrode connected to the semiconductor layer; a drain electrode that has an edge opposing an edge of the source electrode with respect to the intrinsic portion of the semiconductor layer and is connected to the semiconductor layer; and a pixel electrode connected to the drain electrode, wherein the intrinsic portion has a curved surface contacting the gate insulating layer.

The intrinsic portion may have a curved section including the curved surface and the curved surface may have a wavelike shape.

The gate insulating layer may have a curved section and the gate electrode may include a first film disposed and a second film disposed closer to the semiconductor layer than the first film and including a plurality of bars extending between the source electrode and the drain electrode.

The semiconductor layer may include amorphous silicon and the thin film transistor may further include ohmic contacts disposed between the semiconductor layer and the source and the drain electrodes.

The semiconductor layer may include polysilicon, and the semiconductor layer may further include extrinsic portions disposed opposite each other with respect to the intrinsic portion and connected to the source and the drain electrodes.

The thin film transistor array panel may further include: a third signal line transmitting a gate signal; a fourth signal line transmitting data signals; a transistor connected to the second to the fourth signal lines and transmitting the data signals to the second signal line in response to the gate signal; a common electrode disposed opposite the pixel electrode; and a light emitting member disposed between the pixel electrode and the common electrode.

BRIEF DESCRIPTION OF THE DRAWINGS

The present invention will become more apparent by describing preferred embodiments thereof in detail with reference to the accompanying drawings in which.

DETAILED DESCRIPTION OF EMBODIMENTS

Figure 1:
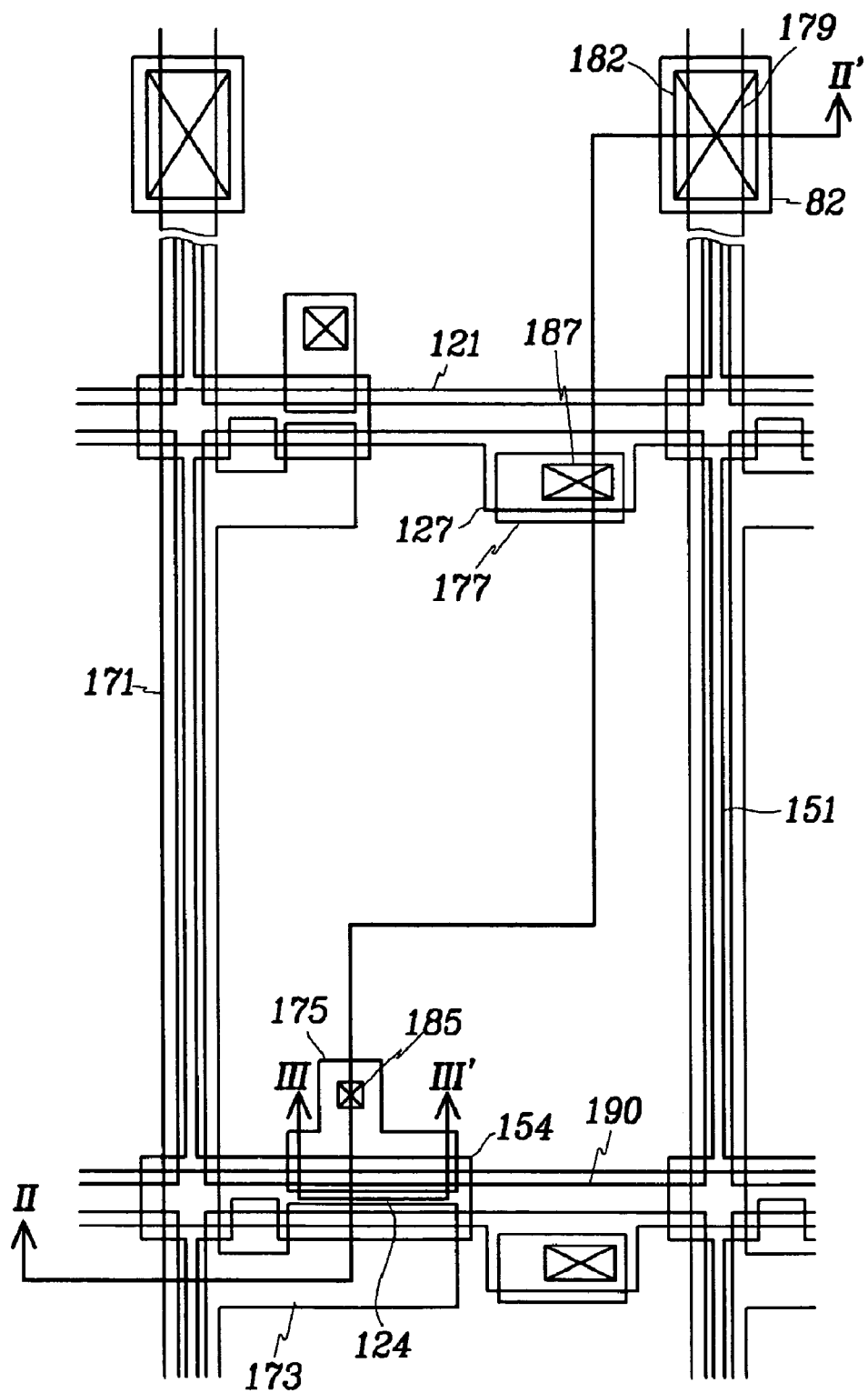
FIG. 1 is an exemplary layout view of a TFT array panel according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels according to embodiments of the present invention will be described with reference to the accompanying drawings.

A TFT array panel for an LCD will be described in detail with reference to FIGS. 1-3.

Figure 2:
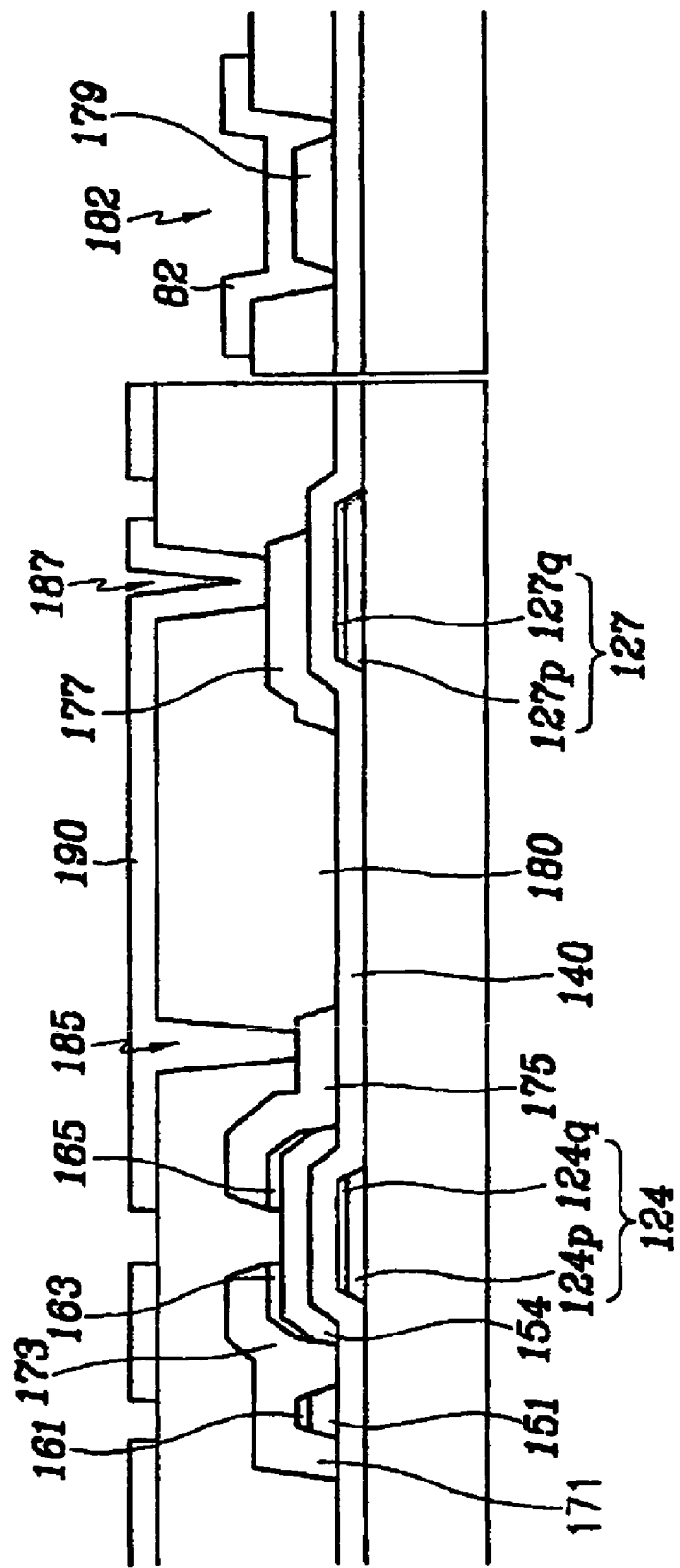
FIG. 2 is a sectional view of the TFT array panel shown in FIG. 1 taken along the line II-II'.
Figure 3:
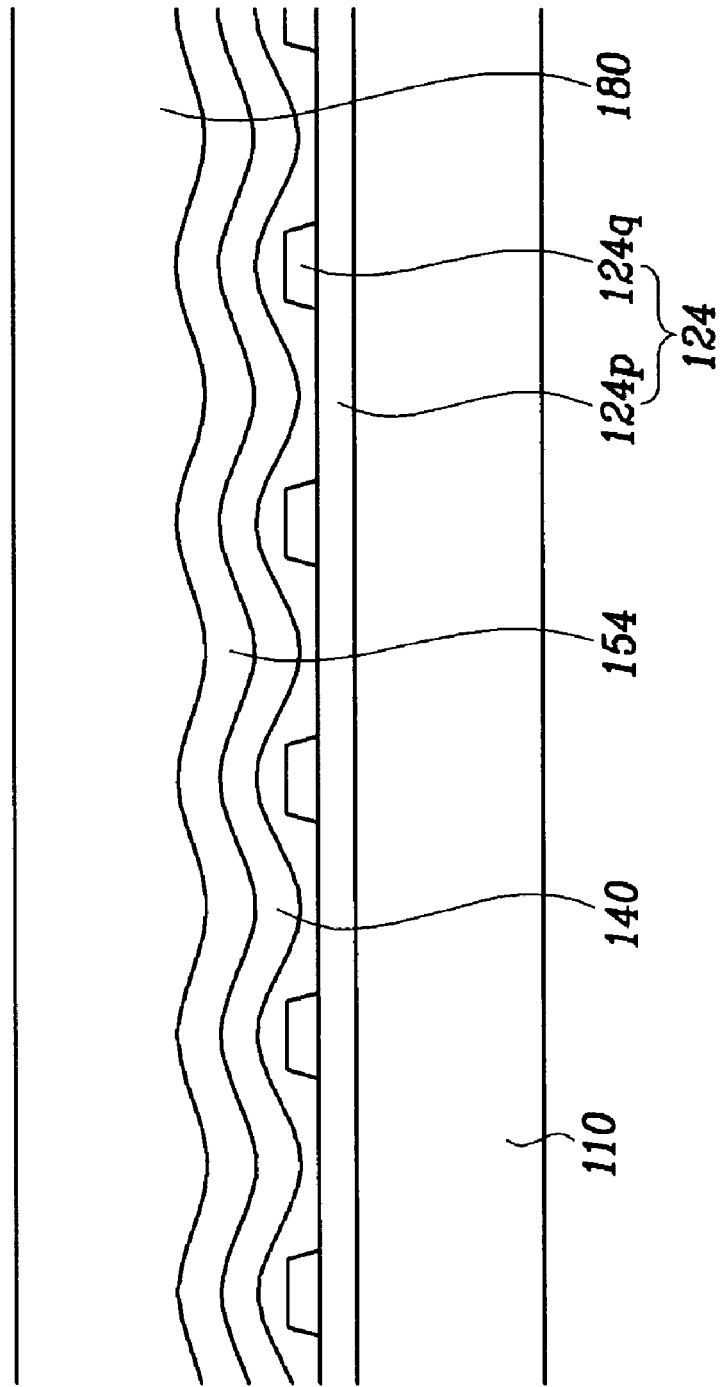
FIG. 3 is a sectional view of the TFT array panel shown in FIG. 1 taken along the line III-III'.

FIG. 1 is an exemplary layout view of a TFT array panel according to an embodiment of the present invention, FIG. 2 is a sectional view of the TFT array panel shown in FIG. 1 taken along the line II-II', and FIG. 3 is a sectional view of the TFT array panel shown in FIG. 1 taken along the line III-III'.

A plurality of gate lines 121 for transmitting gate signals are formed on an insulating substrate 110. Each gate line 121 extends substantially in a transverse direction and it includes a plurality of portions forming a plurality of gate electrodes 124 and a plurality of projections 127 protruding downward. The gate lines 121 may extend to be connected to a driving circuit (not shown) integrated on the substrate 110, or it may have an end portion (not shown) having a large area for connection with another layer or an external driving circuit mounted on the substrate 110 or on another device such as a flexible printed circuit film (not shown) that may be attached to the substrate 110.

The gate lines 121 include two films having different physical characteristics, a lower film and an upper film. One of the upper and the lower films is preferably made of low resistivity metal including Al containing metal such as Al and Al alloy, Ag containing metal such as Ag and Ag alloy, and Cu containing metal such as Cu and Cu alloy for reducing signal delay or voltage drop in the gate lines 121. On the other hand, the other of the upper and the lower films is preferably made of material such as Cr, Mo, Mo alloy, Ta and Ti, which has good physical, chemical, and electrical contact characteristics with other materials such as indium tin oxide (ITO) and indium zinc oxide (IZO). Examples of the combinations are a lower Cr film and an upper Al (or Al—Nd) film and an upper Mo (or Mo alloy) film and a lower Cr film and an upper Al film. In FIG. 2, the lower and the upper films of the gate electrodes 124 are indicated by reference numerals 124p and 124q, respectively, and the lower and the upper films of the projections 127 are indicated by reference numerals 127p and 127q, respectively.

Here, the upper film 124p of the gate lines 124 includes a plurality of bars or stripes extending substantially in a longitudinal direction as shown in FIG. 3.

However, the gate lines 121 may include a single layer preferably made of Al containing metal, Ag containing metal, Cu containing metal, Cr, Mo, Mo alloy, Ta, or Ti. Alternatively, the gate lines 121 may have a multi-layered structure including at least three layers that include an intermediate Al layer.

In addition, the lateral sides of the gate lines 121 are inclined relative to a surface of the substrate 110, and the inclination angle thereof ranges about 30-80 degrees.

A gate insulating layer 140 preferably made of silicon nitride (SiNx) is formed on the gate lines 121. The gate insulating layer 140 includes a plurality of portions having wavelike sections (referred to as "wavelike portions" hereinafter) disposed on the striped portions of the gate electrodes 124.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 124. The width of each semiconductor stripe 151 becomes large near the gate lines 121 such that the semiconductor stripe 151 covers large areas of the gate lines 121. The projections 154 of the semiconductor islands 151 also include a plurality of wavelike portions following the wavelike sections of the gate insulating layer 140.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to a surface of the substrate 110, and the inclination angles thereof are preferably in a range of about 30-80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121. Each data line 171 includes an end portion 179 for contact with another layer or an external device and the end portion 179 may have an increased area for enhancing the contact.

A plurality of branches of each data line 171, which project toward the drain electrodes 175, form a plurality of source electrodes 173. Each pair of the source electrodes 173 and the drain electrodes 175 are separated from each other and disposed opposite each other with respect to a gate electrode 124. The bars of the gate electrode 124 extend from one of the opposite edges of the source and the drain electrodes 173 and 175 to the other and thus the waves of the semiconductor projections 154 proceed along the opposite edges of the source and the drain electrodes 173 and 175.

A gate electrode 124, a source electrode 173, and a drain electrode 175 along with a projection 154 of a semiconductor stripe 151 form a TFT having a channel formed in the projection 154 disposed between the source electrode 173 and the drain electrode 175. The current in the TFT flows across the channel from one of the opposite edges of the source and the drain electrodes 173 and 175 to the other. Accordingly, the current driving capacity of the TFT is determined by the width of the channel of the TFT. The wavelike portion of the semiconductor projection 154 increases the width of the channel of the TFT.

The wavelike section of the semiconductor projection 154 can be substituted with any curved section for increasing the channel length of the TFT. In addition, the semiconductor projection 154 may have a curved surface contacting the gate insulating layer 140 rather than a curved section as a whole since the charge carriers of the TFT move near the surface.

The storage capacitor conductors 177 overlap the projections 127 of the gate lines 121.

The data lines 171, the drain electrodes 175, and the storage capacitor conductors 177 are preferably made of refractory metal such as Cr, Mo, Ti, Ta and their alloys. However, they may also have a multi-layered structure including a low resistivity layer and a good contact layer. A good example of the combinations is a lower Mo containing metal film, a middle Al containing film, and an upper Mo containing film as well as above-described a lower Cr film and an upper Al (or Al—Nd) film and an upper Mo (or Mo alloy) film and a lower Cr film and an upper Al film.

Like the gate lines 121, the data lines 171, the drain electrodes 175, and the storage capacitor conductors 177 have tapered lateral sides relative to a surface of the substrate 110, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage electrode capacitors 177, and exposed portions of the semiconductor stripes 151, which are not covered with the data lines 171 and the drain electrodes 175. The passivation layer 180 is preferably made of inorganic insulator such as silicon nitride or silicon oxide, photosensitive organic material having a good flatness characteristic, or low dielectric insulating material such as a-Si:C:O and a-Si:O:F formed by plasma enhanced chemical vapor deposition (PECVD). The passivation layer 180 may have a double-layered structure including a lower inorganic film and an upper organic film to prevent the direct contact between semiconductor and organic material.

The passivation layer 180 has a plurality of contact holes 182, 185 and 187 exposing the end portions 179 of the data lines 171, the drain electrodes 175, and the storage conductors 177, respectively. The contact holes 182 expose edges of the end portions 179 of the data lines 171 and it is preferable that the contact holes 182 do not expose an Al layer.

A plurality of pixel electrodes 190 and a plurality of contact assistants 82, which are preferably made of ITO or IZO, are formed on the passivation layer 180.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177.

The pixel electrodes 190 supplied with the data voltages generate electric fields in cooperation with a common electrode (not shown) on another panel (not shown), which reorient liquid crystal molecules in a liquid crystal layer (not shown) disposed therebetween.

A pixel electrode 190 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 190 and overlap the projections 127, under the pixel electrodes 190 for decreasing the distance between the terminals.

The pixel electrodes 190 overlap the gate lines 121 and the data lines 171 to increase aperture ratio although it is optional.

The contact assistants 82 cover the contact holes 182 to be connected to the exposed end portions 179 of the data lines 171 through the contact holes 182. The contact assistants 82 protect the exposed portions 179 and complement the adhesion between the exposed portions 179 and external devices.

The pixel electrodes 190 may be made of transparent conductive polymer or made of opaque reflective metal for a reflective LCD. In these cases, the contact assistants 82 may be made of material such as ITO or IZO different from the pixel electrodes 190.

A TFT array panel for an LCD according to another embodiment of the present invention will be described in detail with reference to FIGS. 4-7.

Figure 4:
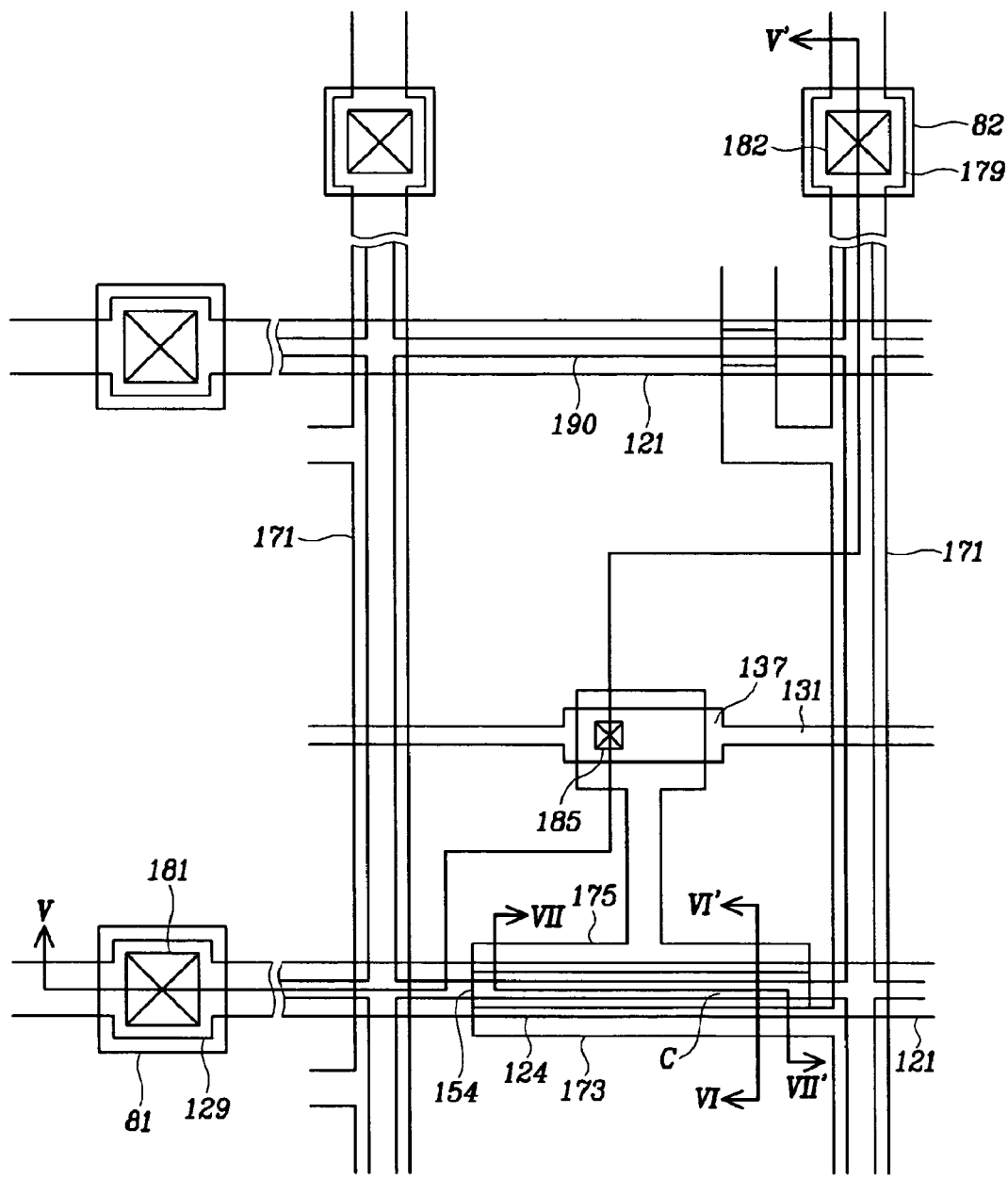
FIG. 4 is a layout view of a TFT array panel for an LCD according to another embodiment of the present invention.
Figure 5:
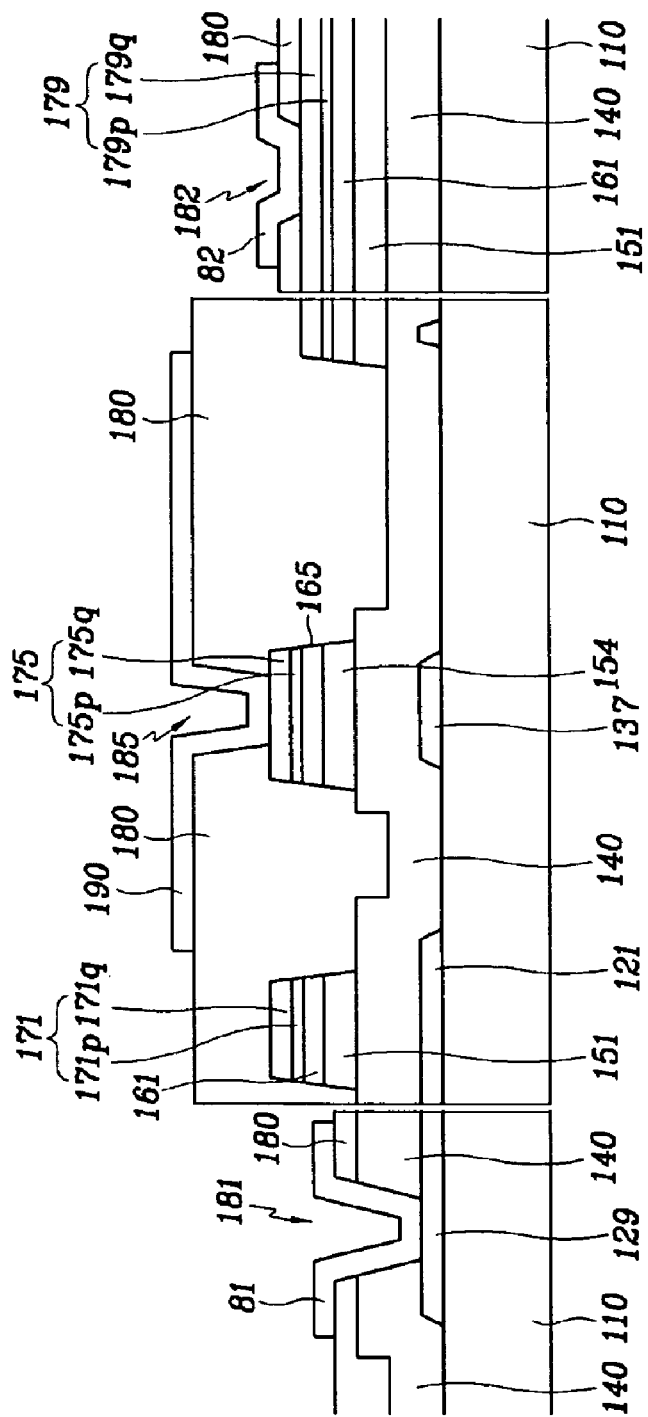
FIG. 5-7 are sectional views of the TFT array panel shown in FIG. 4 taken along the lines V-V', VI-VI', and VII-VII', respectively.
Figure 6:
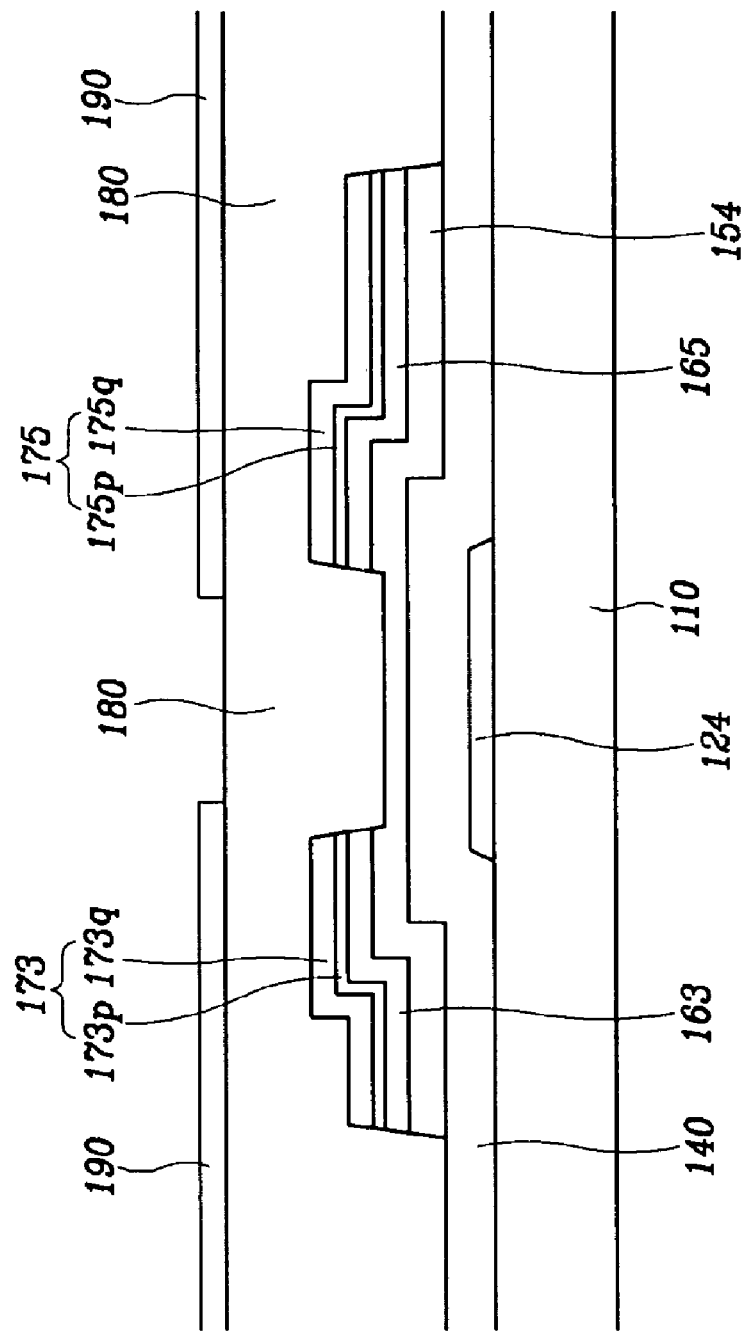
Figure 7:
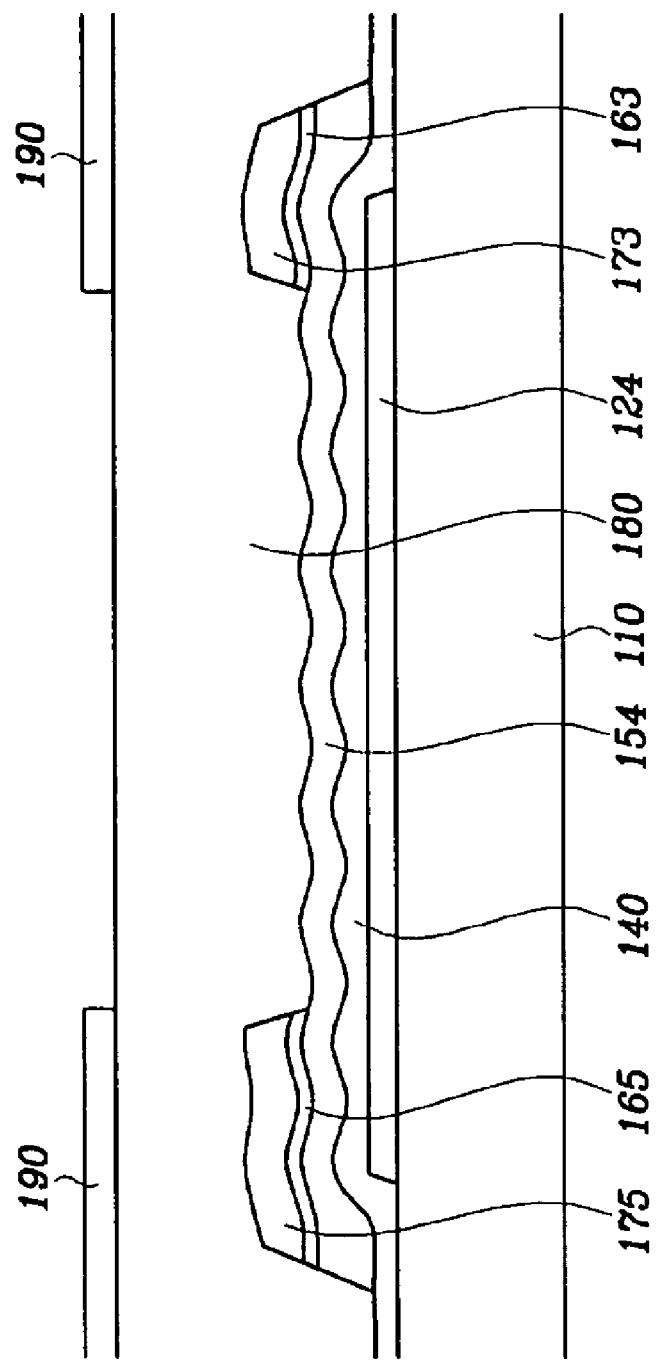

FIG. 4 is a layout view of a TFT array panel for an LCD according to another embodiment of the present invention, and FIG. 5-7 are sectional views of the TFT array panel shown in FIG. 4 taken along the lines V-V', VI-VI', and VII-VII', respectively.

Referring to FIGS. 4-7, a layered structure of the TFT array panel according to this embodiment is almost the same as that shown in FIGS. 1-3.

That is, a plurality of gate lines 121 including a plurality of gate electrodes 124 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, and a plurality of drain electrodes 175 are formed on the ohmic contacts 161 and 165, and a passivation layer 180 are formed thereon. A plurality of contact holes 182 and 185 are provided at the passivation layer 180, and a plurality of pixel electrodes 190 and a plurality of contact assistants 82 are formed on the passivation layer 180.

Different from the TFT array panel shown in FIGS. 1-3, the gate lines 121 of the TFT array panel shown in FIGS. 4-7 have a single layer structure and the gate insulating layer 140 has a wavelike surface disposed on the projections 154 of the semiconductor stripes 151 for increasing the channel length of TFTs as shown in FIG. 7.

The TFT array panel according to this embodiment provides a plurality of storage electrode lines 131, which are separated from the gate lines 121, on the same layer as the gate lines 121 without providing projections at the gate lines 121. The storage electrode lines 131 are supplied with a predetermined voltage such as the common voltage. Without providing the storage capacitor conductors 177 shown in FIGS. 1-3, the storage electrode lines 131 includes a plurality of storage electrodes 137 having a large area and the drain electrodes 175 extend to overlap the storage electrodes 137 to form storage capacitors. The storage electrode lines 131 may be omitted if the storage capacitance generated by the overlapping of the gate lines 121 and the pixel electrodes 190 is sufficient. The storage electrode lines 131 may be disposed near the gate lines 121 to increase the aperture ratio.

In addition, the semiconductor stripes 151 have almost the same planar shapes as the data lines 171 and the drain electrodes 175 as well as the underlying ohmic contacts 161 and 165. However, the projections 154 of the semiconductor stripes 151 include some exposed portions, which are not covered with the data lines 171 and the drain electrodes 175, such as portions located between the source electrodes 173 and the drain electrodes 175.

Moreover, the gate lines 121 also have expanded end portions 129. Accordingly, a plurality of contact holes 181 exposing the end portions 129 of the gate lines 121 are provided at the gate insulating layer 140 and the passivation layer 180, and a plurality of contact assistants 81 connected to the end portions 129 through the contact holes 181 are additionally provided.

Many of the above-described features of the TFT array panel for an LCD shown in FIGS. 1-3 may be appropriate to the TFT array panel shown in FIGS. 4-7.

The channels having wavelike sections are also applicable to TFTs of a gate driver or a data driver, which are integrated on the TFT array panel.

A TFT array panel for an OLED according to an embodiment of the present invention will be described in detail with reference to FIGS. 8-10.

Figure 8:
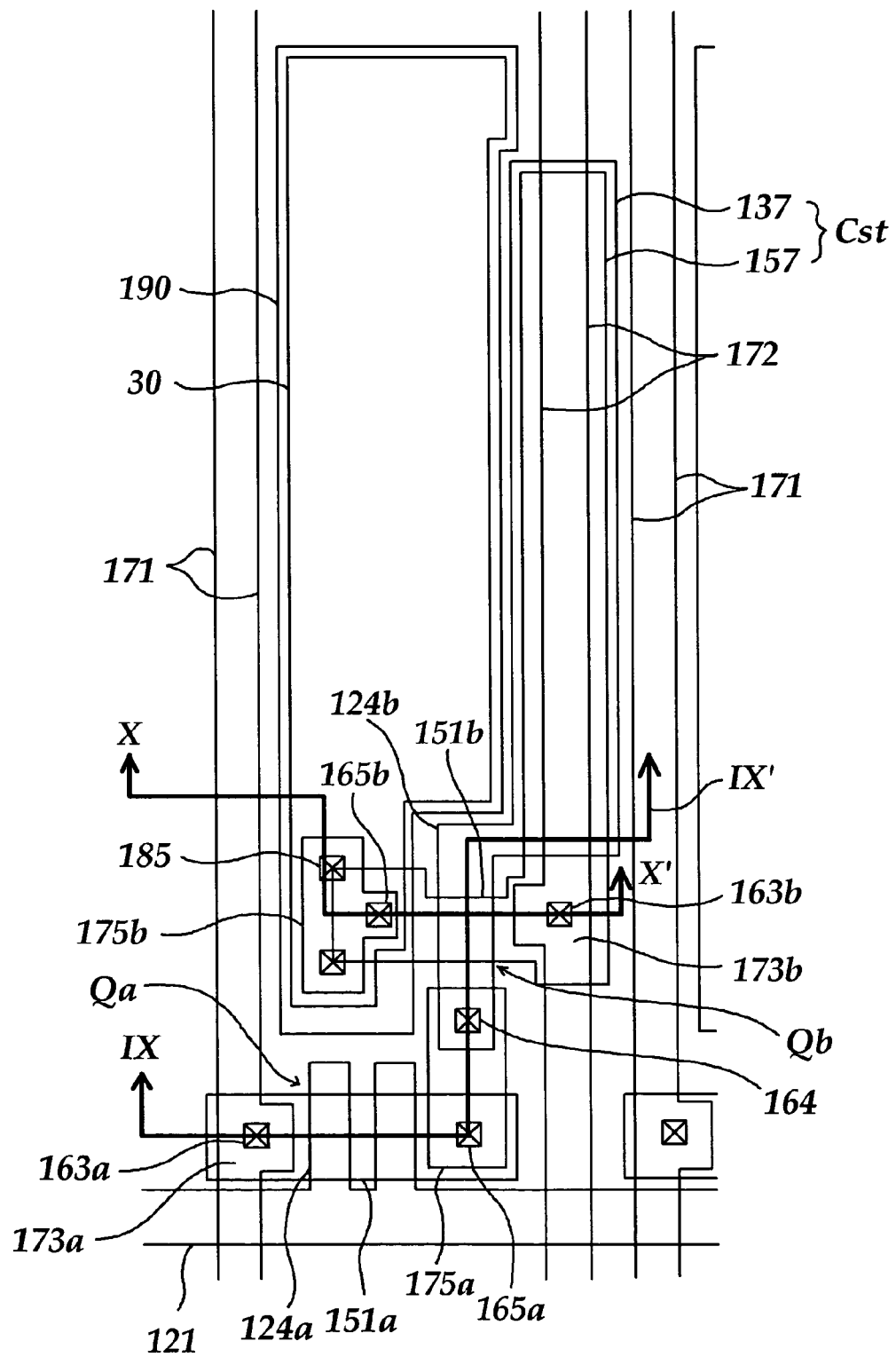
FIG. 8 is a layout view of a TFT array panel for an OLED according to an embodiment of the present invention.
Figure 9:
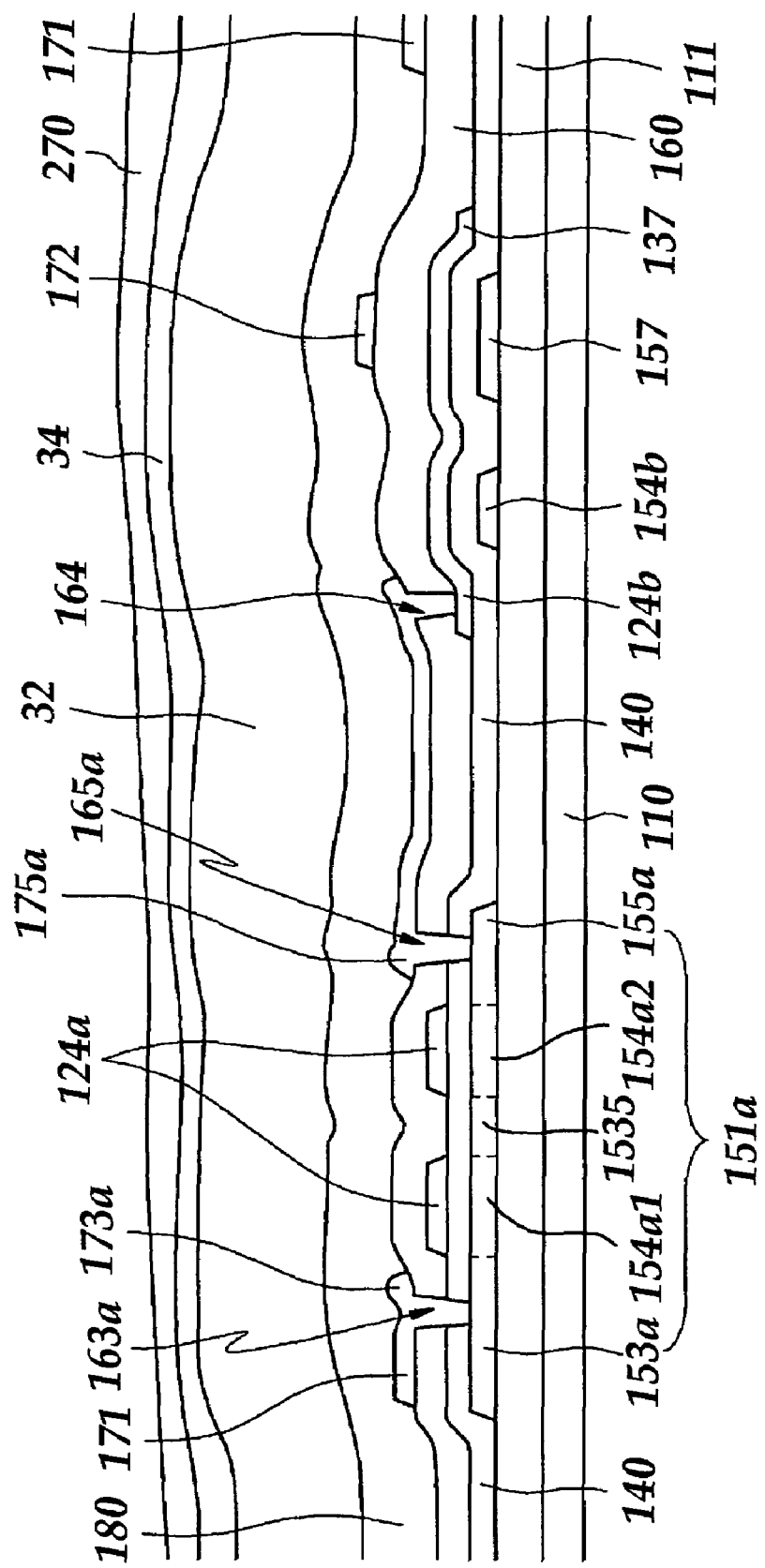
FIG. 9 is a sectional view of the TFT array panel shown in FIG. 8 taken along the line IX-IX'.
Figure 10:
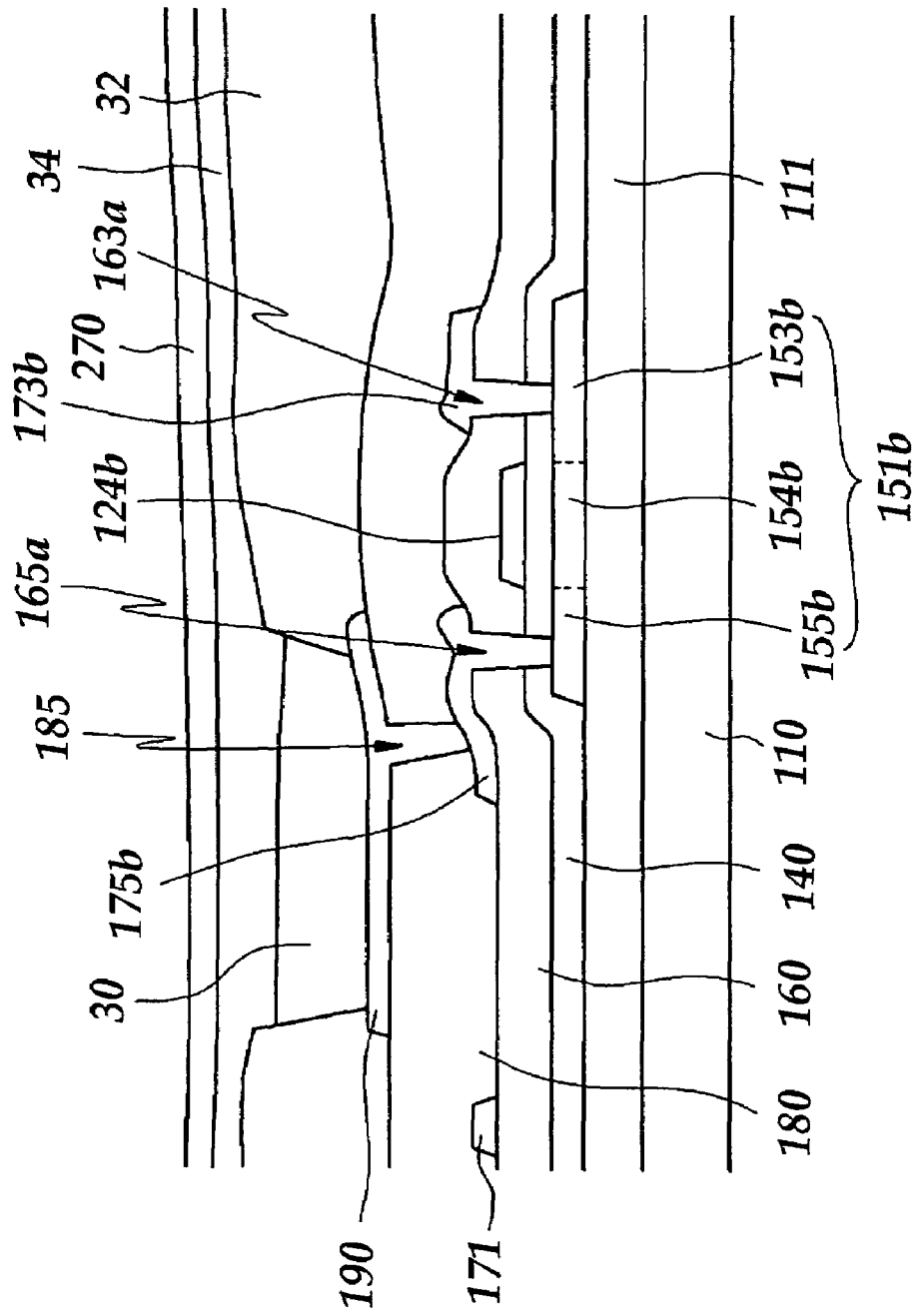
FIG. 10 is a sectional view of the TFT array panel shown in FIG. 8 taken along the line X-X'.

FIG. 8 is a layout view of a TFT array panel for an OLED according to an embodiment of the present invention, FIG. 9 is a sectional view of the TFT array panel shown in FIG. 8 taken along the line IX-IX', and FIG. 10 is a sectional view of the TFT array panel shown in FIG. 8 taken along the line X-X'.

A blocking layer 111 preferably made of silicon oxide or silicon nitride is formed on an insulating substrate 110 preferably made of transparent glass. The blocking film 111 may have a dual-layered structure.

A plurality of semiconductor islands 151a and 151b preferably made of polysilicon are formed on the blocking film 111. Each of the semiconductor islands 151a and 151b includes a plurality of extrinsic regions containing N type or P type conductive impurity and at least one intrinsic region hardly containing conductive impurity.

Regarding a semiconductor island 151a for a switching TFT Qa, the extrinsic regions include a first source region 153a, an intermediate region 1535, and a first drain region 155a, which are doped with N type impurity and separated from one another, and the intrinsic regions include such as a pair of (first) channel regions 154a1 and 154a2 disposed between the extrinsic regions 153a, 1535 and 155a.

Concerning a semiconductor island 151b for a driving TFT Qb, the extrinsic regions include a second source region 153b and a second drain region 155b, which are doped with P type impurity and separated from one another, and the intrinsic region includes a channel region 154b disposed between the second source region 153b and the second drain region 155b. The second source region 153b extends to form a storage region 157.

The extrinsic regions may further include lightly doped regions (not shown) disposed between the channel regions 154a1, 154a2 and 154b and the source and the drain regions 153a, 155a, 153b and 155b. The lightly doped regions may be substituted with offset regions that contain substantially no impurity.

Alternatively, the extrinsic regions 153a and 155a of the first semiconductor islands 151a are doped with P type impurity, while the extrinsic regions 153b and 155b of the second semiconductor islands 151b are doped with N type impurity, depending on driving conditions. The conductive impurity includes P type impurity such as boron (B) and gallium (Ga) and N type impurity such as phosphorous (P) and arsenic (As).

Although it is not shown in the figures, the semiconductor islands 151a and 151b have curved sections such as those shown in FIGS. 3 and 7.

A gate insulating layer 140 preferably made of silicon oxide or silicon nitride is formed on the semiconductor islands 151a and 151b and the blocking film 111.

A plurality of gate conductors including a plurality of gate lines 121 including a plurality of pairs of first gate electrodes 124a and a plurality of second gate electrodes 124b are formed on the gate insulating layer 140.

The gate lines 121 for transmitting gate signals extend substantially in a transverse direction. Each pair of first gate electrodes 124a protrude upward from the gate line 121 and they intersect the first semiconductor islands 151a such that they overlap the pair of the first channel regions 154a. Each gate line 121 may include an expanded end portion having a large area for contact with another layer or an external driving circuit. The gate lines 121 may be directly connected to a gate driving circuit for generating the gate signals, which may be integrated on the substrate 110.

The second gate electrodes 124b are separated from the gate lines 121 and intersect the second semiconductor islands 151b such that they overlap the second channel regions 154b. The second gate electrodes 124b extend to form storage electrodes 137 overlapping the storage electrode regions 157 of the second semiconductor islands 151b to form storage capacitors Cst.

The gate conductors 121 and 124b are preferably made of low resistivity material including Al containing metal such as Al and Al alloy (e.g. Al—Nd), Ag containing metal such as Ag and Ag alloy, and Cu containing metal such as Cu and Cu alloy. The gate conductors 121 and 124b may have a multi-layered structure including two films having different physical characteristics. One of the two films is preferably made of low resistivity metal including Al containing metal, Ag containing metal, and Cu containing metal for reducing signal delay or voltage drop in the gate conductors 121 and 124b. The other film is preferably made of material such as Cr, Mo and Mo alloy, Ta or Ti, which has good physical, chemical, and electrical contact characteristics with other materials such as indium tin oxide (ITO) or indium zinc oxide (IZO). Good examples of the combination of the two films are a lower Cr film and an upper Al—Nd alloy film and a lower Al film and an upper Mo film.

In addition, the lateral sides of the gate conductors 121 and 124b are inclined relative to a surface of the substrate 110, and the inclination angle thereof ranges about 30-80 degrees.

An interlayer insulating film 160 is formed on the gate conductors 121 and 124b. The interlayer insulating layer 160 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride and silicon oxide.

The interlayer insulating layer 160 has a plurality of contact holes 164 exposing the second gate electrodes 124b. In addition, the interlayer insulating layer 160 and the gate insulating layer 140 have a plurality of contact holes 163a, 163b, 165a and 165b exposing the source regions 153a and 153b and the drain regions 155a and 155b, respectively.

A plurality of data conductors including a plurality of data lines 171, a plurality of voltage transmission lines 172, and a plurality of first and second drain electrodes 175a and 175b are formed on the interlayer insulating film 160. The data lines 171 for transmitting data signals extend substantially in the longitudinal direction and intersect the gate lines 121. Each data line 171 includes a plurality of first source electrodes 173a connected to the first source regions 153a through the contact holes 163a. Each data line 171 may include an expanded end portion having a large area for contact with another layer or an external driving circuit. The data lines 171 may be directly connected to a data driving circuit for generating the gate signals, which may be integrated on the substrate 110.

The voltage transmission lines 172 for transmitting driving voltages for the driving TFT Qb extend substantially in the longitudinal direction and intersect the gate lines 121. Each voltage transmission line 172 includes a plurality of second source electrodes 173b connected to the second source regions 153b through the contact holes 163b. The voltage transmission lines 171 may be connected to each other.

The first drain electrodes 175a are separated from the data lines 171 and the voltage transmission lines 172 and connected to the first drain regions 155a through the contact holes 165 and to the second gate electrodes 124b through the contact hole 164.

The second drain electrodes 175b are separated from the data lines 171 and the voltage transmission lines 172 and connected to the second drain regions 155b through the contact holes 165b.

The data conductors 171, 172, 175a and 175b are preferably made of refractory metal including Cr, Mo, Ti, Ta or alloys thereof. They may have a multi-layered structure preferably including a low resistivity film and a good contact film. A good example of the multi-layered structure includes a Mo lower film, an Al middle film, and a Mo upper film as well as the above-described combinations of a Cr lower film and an Al—Nd upper film and an Al lower film and a Mo upper film.

Like the gate conductors 121 and 124b, the data conductors 171, 172, 175a and 175b have tapered lateral sides relative to the surface of the substrate 110, and the inclination angles thereof range about 30-80 degrees.

A passivation layer 180 is formed on the data conductors 171, 172, 175a and 175b. The passivation layer 180 is also preferably made of photosensitive organic material having a good flatness characteristic, low dielectric insulating material such as a-Si:C:O and a-Si:O:F formed by PECVD, or inorganic material such as silicon nitride and silicon oxide.

The passivation layer 180 has a plurality of contact holes 185 exposing the second drain electrodes 175b. The passivation layer 180 may further has a plurality of contact holes (not shown) exposing end portions of the data lines 171 and the passivation layer 180 and the interlayer insulating layer 160 may have a plurality of contact holes (not shown) exposing end portions of the gate lines 121.

A plurality of pixel electrodes 190 are formed on the passivation layer 180. The pixel electrodes 190 are connected to the second drain electrodes 175b through the contact holes 185 and they are preferably made of at least one of reflective opaque material such as Al or Ag alloy. However, the pixel electrode 190 may be made of transparent conductor such as ITO or IZO and opaque reflective conductor such as Al, Ag, Ca, Ba and Mg. The pixel electrode 190 may be incorporated with the second drain electrode 175b for reducing the manufacturing cost.

A plurality of contact assistants or connecting members (not shown) may be also formed on the passivation layer 180 such that they are connected to the exposed end portions of the gate lines 121 or the data lines 171.

A partition 32 for separating pixels of the TFT array panel is formed on the passivation layer 180 and the pixel electrodes 190. The partition 32 surrounds the pixel electrodes 190 like a bank to define openings to be filled with organic light emitting material. The partition 32 is preferably made of organic insulating material and, more preferably, made of a photosensitive material containing black pigment, which is exposed to light and developed, such that the partition 32 functions as a light blocking member and a manufacturing method thereof is simplified.

A plurality of light emitting members 30 are formed on the pixel electrodes 190 and disposed in the openings defined by the partition 32. The light emitting members 30 are preferably made of organic material emitting primary-color lights such as red, green and blue lights. The red, green and blue light emitting members 30 are periodically arranged.

A buffer layer 34 is formed on the light emitting members 30 and the partition 32. The buffer layer 34 may be omitted if it is not required.

A common electrode 270 supplied with a predetermined voltage such as a common voltage is formed on the buffer layer 34. The common electrode 270 is preferably made of transparent conductive material such as ITO and IZO or opaque metal such as Al, Ag, Ca, Ba and Mg.

An auxiliary electrode (not shown) made of low resistivity material is optionally provided for compensating the conductivity of the common electrode 270. The auxiliary electrode may be disposed between the common electrode 270 and the buffer layer 34 or on the common electrode 270, and it preferably has a matrix form and is disposed along the partition 32 such that it does not overlap the light emitting member 30.

In the above-described TFT array panel, a first semiconductor island 151a, a first gate electrode 124a connected to the gate line 121, a first source electrode 153a connected to the data line 171, and a first drain electrode 155a form a switching TFT Qa. In addition, a second semiconductor island 151b, a second gate electrode 124b connected to the first drain electrode 155a, a second source electrode 153b connected to the voltage transmission line 172, and a second drain electrode 155b connected to a pixel electrode 190 form a driving TFT Qb. Furthermore, a pixel electrode 190 and a common electrode 270 serve as an anode and a cathode, respectively, and a storage region 157 connected to a first drain region 155a and a storage electrode 137 connected to a voltage transmission line 172 through a second source electrode 153b form a storage capacitor Cst.

The switching TFT Qa transmits data signals from the data line 171 to the driving TFT Qb in response to the gate signal from the gate line 121. Upon the receipt of the data signal, the driving TFT Qb generates a current having a magnitude depending on the voltage difference between the second gate electrode 124b and the second source electrode 173b. In addition, the voltage difference is charged in the storage capacitor Cst to be maintained after the switching TFT Qa is turned off. The current driven by the driving TFT Qb enters into the light emitting member 30 through the pixel electrode 190 and reaches the common electrode 270. The current flowing in the light emitting member 30 means that positive charge carriers such as holes and negative charge carriers such as electrons are injected into the light emitting member 30 from the anode 190 and the cathode 270, respectively, and they are drifted by an electric field generated by the voltage difference between the anode 190 and the cathode 270. The holes and the electrons in the light emitting member 30 then meet each other to be recombined into excitons, which emit light with a predetermined wavelength. The intensity of the emitted light depends on the current driven by the driving TFT Qb and flowing in the light emitting member 30.

The emitted light goes out of the display panel after passing through the common electrode 270 or the pixel electrode 190. A transparent common electrode 270 and an opaque pixel electrode 190 are applicable to a top emission type EL display, which displays an image on its top surface. On the contrary, a transparent pixel electrode 190 and an opaque common electrode 270 are applicable to a bottom emission type EL display, which displays an image on its bottom surface.

Now, a TFT array panel for an LCD according to another embodiment of the present invention will be described in detail with reference to FIGS. 11 and 13.

Figure 11:
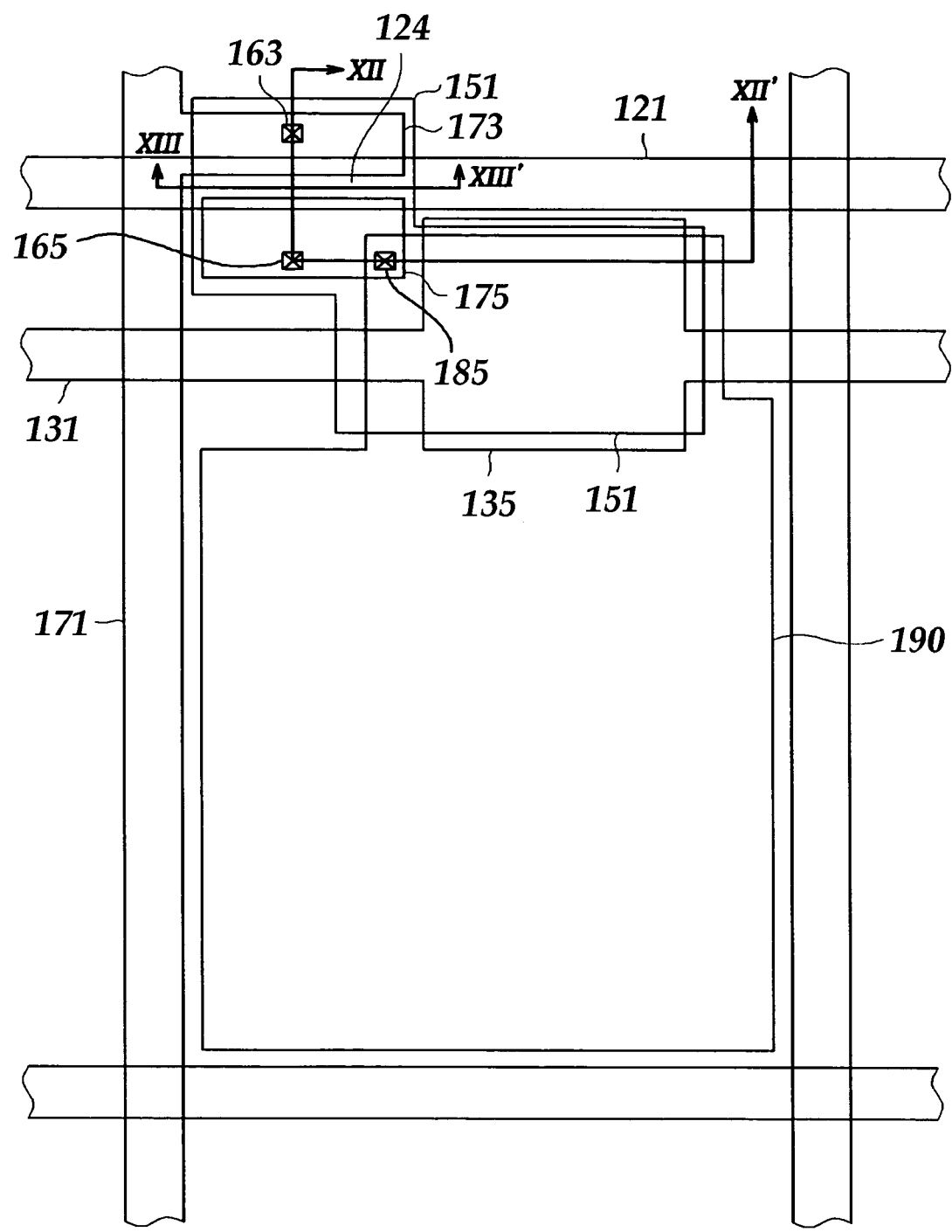
FIG. 11 is a layout view of a TFT array panel according to an embodiment of the present invention.
Figure 12:
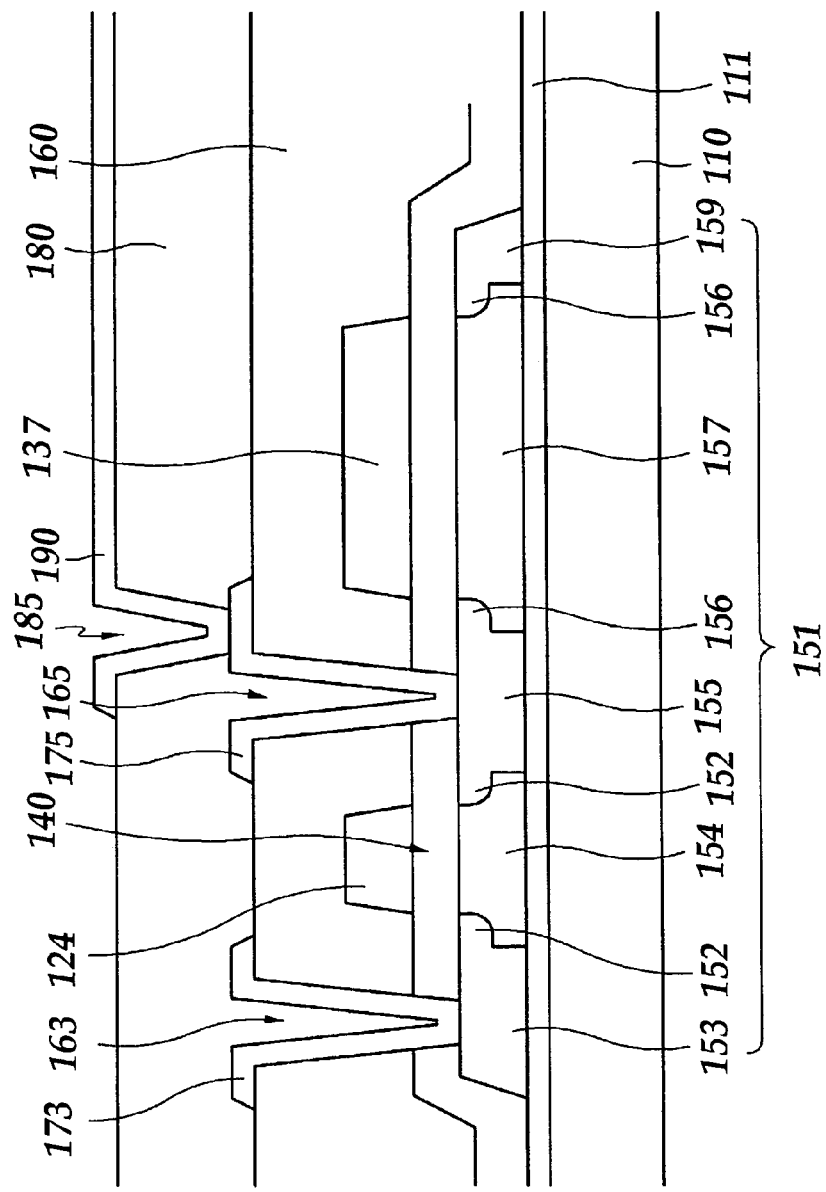
FIGS. 12 and 13 are a sectional view of the TFT array panel taken along the lines XXVI-XXVI'.
Figure 13:
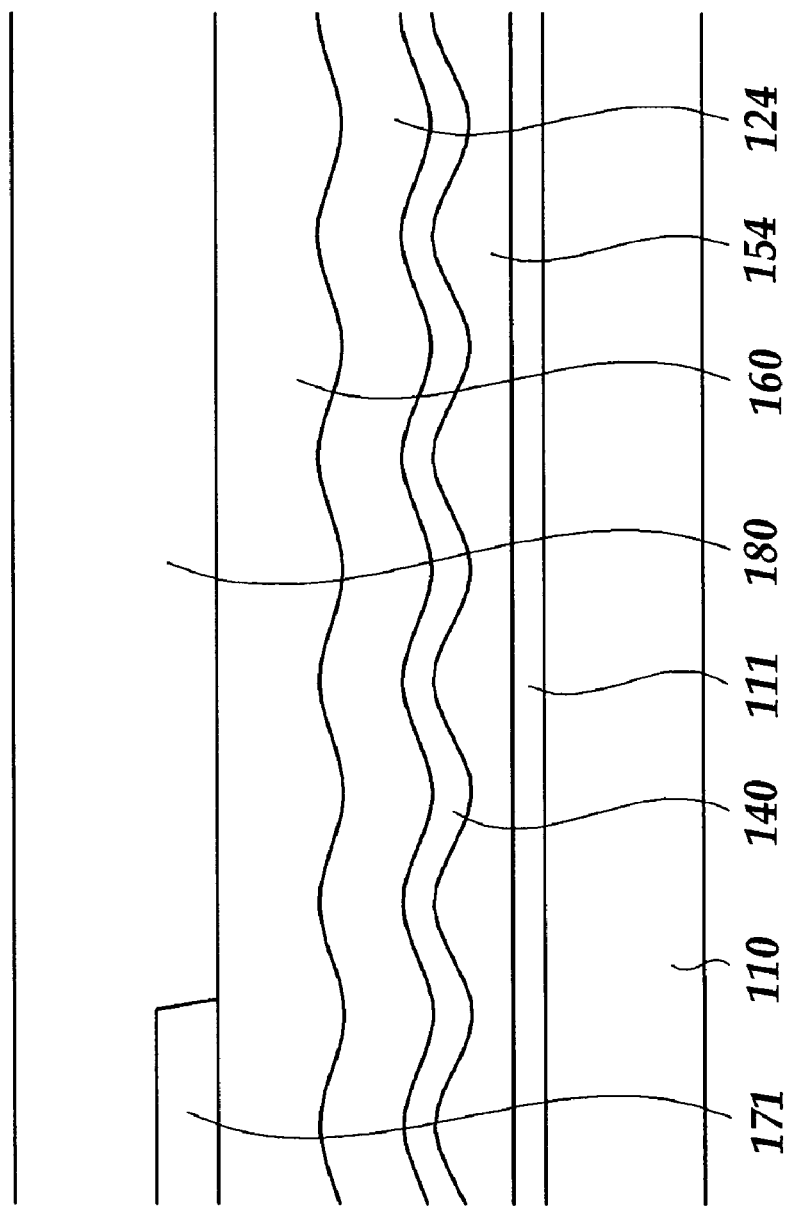

FIG. 11 is a layout view of a TFT array panel according to an embodiment of the present invention and FIGS. 12 and 13 are a sectional view of the TFT array panel taken along the lines XXVI-XXVI'.

Referring to FIGS. 11-13, a layered structure of the TFT array panel for an LCD according to this embodiment is similar to the TFT array panel for an OLED shown in FIGS. 8-10.

That is, a blocking film 111 is formed on a substrate 110, and a plurality of semiconductor islands 151 are formed thereon. Each of the semiconductor islands 151 include a channel region 154, a storage regions 157, source and drain regions 153 and 155. A gate insulating layer 140 is formed on the semiconductor islands 151 and a plurality of gate lines 121 including gate electrodes 124 are formed thereon. An interlayer insulating layer 160 is formed on the gate lines 121 and a plurality of data lines 171 including source electrodes 173 and a plurality of drain electrodes 175 are formed on the interlayer insulating layer 160. A passivation layer 180 is formed on the data lines 171, the drain electrodes 175 and the interlayer insulating layer 160 and a plurality of pixel electrodes 190 are formed on the passivation layer 180. The interlayer insulating layer 160 has a plurality of contact holes 163 and 165 exposing the source and the drain regions 153 and 155, respectively, and the passivation layer 180 has a plurality of contact holes 185 exposing the drain electrodes 175.

As shown in FIG. 13, the semiconductor islands 151 also have wavelike sections for increasing channel width of TFTs and portions of the gate insulating layer 140 and the gate electrodes 124 disposed thereon also have wavelike sections.

Different from the TFT array panel shown for an OLED in FIGS. 8-10, the TFT array panel for an LCD shown in FIGS. 11-13 includes no light emitting members 30, no partition 32, and no buffer layer 34. Instead, an LCD including the TFT array panel may include a liquid crystal layer (not shown) disposed between the pixel electrodes 190 and a common electrode (not shown).

Each pixel of the TFT array panel includes only one TFT connected to a gate line 121, a data line 171, and a pixel electrode 190. Accordingly, there is one semiconductor island 151, one pair of source and drain electrodes 173 and 175, and one pair of contact holes 163 and 165. The drain electrodes 175 are directly connected to the pixel electrodes 190 through the contact holes 185 and there is no contact hole 164.

Each semiconductor island 151 further include a storage region 157 without impurity and dummy regions 159 containing impurity like the source and the drain regions 153 and 155. The semiconductor island 151 further includes lightly doped regions 152 and 156 disposed between intrinsic regions 151 and 157 and extrinsic regions 153, 155 and 159 and having impurity concentration lower than the source and the drain regions 153 and 155.

In addition, the TFT array panel further includes a plurality of storage electrode lines 131 preferably made of the same layer as the gate lines 121 and extending substantially parallel to the gate lines 121. The storage electrode lines 131 include storage electrodes 137 overlapping the storage regions 157.

Many of the above-described features of the TFT array panel shown in FIGS. 8-10 may be appropriate to the TFT array panel shown in FIGS. 11-13.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A thin film transistor, comprising;
a gate electrode with a flat surface;
a semiconductor layer including an intrinsic portion disposed on the gate electrode;
a gate insulating layer disposed between the semiconductor layer and the gate electrode, the gate insulating layer having a curved surface including a shape of a plurality of waves; and
source and drain electrodes that have edges opposing each other with respect to the intrinsic portion of the semiconductor layer and are connected to the semiconductor layer,
wherein the intrinsic portion has a curved surface and a varying vertical height with respect to the flat surface of the gate electrode between the source electrode and the drain electrode and directly over the flat surface of the gate electrode, the curved surface of the intrinsic portion including a shape of a plurality of waves, thereby increasing a current driving capacity, and wherein the curved surface of the intrinsic portion is formed along the curved surface of the gate insulating layer.

2. The thin film transistor of claim 1, wherein the intrinsic portion has a curved section including the curved surface.

3. The thin film transistor of claim 1, wherein the gate insulating layer has a curved section.

4. The thin film transistor of claim 3, wherein the gate electrode comprises a first film disposed and a second film disposed closer to the semiconductor layer than the first film and including a plurality of bars extending between the source electrode and the drain electrode.

5. The thin film transistor of claim 3, wherein the gate electrode has a curved section.

6. The thin film transistor of claim 1, wherein the semiconductor layer comprises amorphous silicon.

7. The thin film transistor of claim 6, further comprising ohmic contacts disposed between the semiconductor layer and the source and the drain electrodes.

8. The thin film transistor of claim 1, wherein the semiconductor layer comprises polysilicon.

9. The thin film transistor of claim 8, wherein the semiconductor layer further comprises extrinsic portions disposed opposite each other with respect to the intrinsic portion and connected to the source and the drain electrodes.

10. A thin film transistor array panel, comprising:

a first signal line including a gate electrode with a flat surface;

a semiconductor layer including an intrinsic portion disposed on the gate electrode;

a gate insulating layer disposed between the semiconductor layer and the gate electrode, the gate insulating layer having a curved surface including a shape of a plurality of waves;

a second signal line including a source electrode connected to the semiconductor layer;

a drain electrode that has an edge opposing an edge of the source electrode with respect to the intrinsic portion of the semiconductor layer and is connected to the semiconductor layer; and a pixel electrode connected to the drain electrode;

wherein the intrinsic portion has a curved surface and a varying vertical height with respect to the flat surface of the gate electrode between the source electrode and the drain electrode and directly over the flat surface of the gate electrode, the curved surface including a shape of a plurality of waves, thereby increasing a current driving capacity, and wherein the curved surface of the intrinsic portion is formed along the curved surface of the gate insulating layer.

11. The thin film transistor array panel of claim 10, wherein the intrinsic portion has a curved section including the curved surface.

12. The thin film transistor array panel of claim 10, wherein the gate insulating layer has a curved section.

13. The thin film transistor array panel of claim 12, wherein the gate electrode comprises a first film disposed and a second film disposed closer to the semiconductor layer than the first film and including a plurality of bars extending between the source electrode and the drain electrode.

14. The thin film transistor array panel of claim 10, wherein the semiconductor layer comprises amorphous silicon.

15. The thin film transistor array panel of claim 14, further comprising ohmic contacts disposed between the semiconductor layer and the source and the drain electrodes.

16. The thin film transistor array panel of claim 10, further comprising:

a third signal line transmitting a gate signal;

a fourth signal line transmitting data signals;

a transistor connected to the second to the fourth signal lines and transmitting the data signals to the second signal line in response to the gate signal;

a common electrode disposed opposite the pixel electrode; and a light emitting member disposed between the pixel electrode and the common electrode.

* * * * *